US008829558B2

(12) United States Patent
Jeon

(10) Patent No.: US 8,829,558 B2
(45) Date of Patent: Sep. 9, 2014

(54) SEMICONDUCTOR LIGHT-EMITTING DEVICE

(75) Inventor: Soo Kun Jeon, Gyeonggi-do (KR)

(73) Assignee: Semicon Light Co., Ltd., Gyeonggi-Do (KR)

( * ) Notice: Subject to any disclaimer, the term of this patent is extended or adjusted under 35 U.S.C. 154(b) by 55 days.

(21) Appl. No.: 13/431,080

(22) Filed: Mar. 27, 2012

(65) Prior Publication Data
US 2012/0267672 A1 Oct. 25, 2012

(30) Foreign Application Priority Data

Apr. 19, 2011 (KR) .................. 10-2011-0035948

(51) Int. Cl.
*H01L 33/38* (2010.01)
*H01L 33/36* (2010.01)
*H01L 33/14* (2010.01)
H01L 33/42 (2010.01)
H01L 33/20 (2010.01)

(52) U.S. Cl.
CPC ............. *H01L 33/14* (2013.01); *H01L 33/42* (2013.01); *H01L 33/20* (2013.01); *H01L 33/38* (2013.01)
USPC .............................................. 257/99; 257/98

(58) Field of Classification Search
CPC ................................ H01L 33/36; H01L 33/38
USPC ....................................................... 257/99, 98
See application file for complete search history.

(56) References Cited

U.S. PATENT DOCUMENTS

| 5,744,828 | A | 4/1998 | Nozaki et al. | |
|---|---|---|---|---|
| 6,121,635 | A | 9/2000 | Watanabe et al. | |
| 6,307,218 | B1 | 10/2001 | Steigerwald et al. | |
| 6,417,525 | B1 | 7/2002 | Hata | |
| 7,535,028 | B2 * | 5/2009 | Fan et al. | 257/88 |
| 2008/0185606 | A1 * | 8/2008 | Sano et al. | 257/98 |
| 2010/0200877 | A1 * | 8/2010 | Lee | 257/94 |
| 2011/0084268 | A1 * | 4/2011 | Yamazaki et al. | 257/43 |
| 2011/0233603 | A1 * | 9/2011 | Kim et al. | 257/99 |

* cited by examiner

*Primary Examiner* — Steven J Fulk
*Assistant Examiner* — Damon Hillman
(74) *Attorney, Agent, or Firm* — Harness, Dickey & Pierce, P.L.C.

(57) ABSTRACT

The present disclosure relates to a semiconductor light-emitting device, which includes: a plurality of semiconductor layers composed of a first semiconductor layer, a second semiconductor layer, and an active layer; a first electrode disposed on the second semiconductor layer; a high-resistance body interposed between the second semiconductor layer and the first electrode; and a light-transmitting conductive film having an opening through which the high-resistance body is exposed, the first electrode being brought into contact with the light-transmitting conductive film, which is disposed on the high-resistance body, and the high-resistance body, which is exposed through the opening.

17 Claims, 7 Drawing Sheets

SEMICONDUCTOR LIGHT-EMITTING DEVICE

CROSS-REFERENCE TO RELATED APPLICATIONS

This application claims the benefit and priority of Korean Patent Application No. 10-2011-0035948, filed Apr. 19, 2011. The entire disclosure of the above application is incorporated herein by reference.

FIELD

The present invention relates generally to a semiconductor light-emitting device and, more particularly, to a semiconductor light-emitting device which has high light extraction efficiency.

Here, the semiconductor light-emitting device indicates a semiconductor optical device which generates light by recombination of electrons and holes, and its example is a III-nitride semiconductor light-emitting device. The III-nitride semiconductor is made of a compound containing $Al_{(x)}Ga_{(y)}In_{(1-x-y)}N$ ($0 \leq x \leq 1$, $0 \leq y \leq 1$, $0 \leq x+y \leq 1$). Another example is a GaAs semiconductor light-emitting device used for red light emission.

BACKGROUND

This section provides background information related to the present disclosure which is not necessarily prior art.

FIG. 1 is a view showing an example of a conventional III-nitride semiconductor light-emitting device. The III-nitride semiconductor light-emitting device includes a substrate 10 (e.g., sapphire substrate), a buffer layer 20 grown on the substrate 10, an n-type III-nitride semiconductor layer 30 grown on the buffer layer 20, an active layer 40 grown on the n-type III-nitride semiconductor layer 30, a p-type III-nitride semiconductor layer 50 grown on the active layer 40, a current spreading conductive film 60 formed on the p-type III-nitride semiconductor layer 50, a p-side pad electrode 70 formed on the current spreading conductive film 60, an n-side pad electrode 80 formed on the n-type III-nitride semiconductor layer 30 exposed by mesa-etching the p-type III-nitride semiconductor layer 50 and the active layer 40, and a protective film 90.

The current spreading conductive film 60 serves to allow current to be smoothly supplied to the entire p-type III-nitride semiconductor layer 50. The current spreading conductive film 60 may be provided almost on the entire surface of the p-type III-nitride semiconductor layer 50 and formed as a light-transmitting conductive film using ITO or Ni and Au or as a reflective conductive film using Ag, for example.

The p-side pad electrode 70 and the n-side pad electrode 80, which are metal electrodes for current supply and external wire bonding, may be made of any one selected from the group consisting of Ni, Au, Ag, Cr, Ti, Pt, Pd, Rh, Ir, Al, Sn, In, Ta, Cu, Co, Fe, Ru, Zr, W, and Mo, or a combination thereof, for example.

The protective film 90, which is made of $SiO_2$, can be omitted.

With larger areas and higher power consumption of the semiconductor light-emitting device, a plurality of pad electrodes and branch electrodes have been introduced for smooth current spreading in the semiconductor light-emitting device. For instance, FIG. 2 is a view showing an example of an electrode structure described in U.S. Pat. No. 6,307,218. Here, as the semiconductor light-emitting device becomes larger, branch electrodes 910 are disposed between a p-side pad electrode 710 and an n-side pad electrodes 810 at regular intervals so as to improve current spreading.

Although the light-transmitting conductive film and the branch electrode are electrically connected to each other, there is a tendency that current is concentrated on the p-side pad electrode, the n-side pad electrode, and the branch electrode. When current is concentrated on local regions of the semiconductor light-emitting device, light cannot be uniformly emitted from the entire light emission area of the semiconductor light-emitting device, which degrades characteristics of the semiconductor light-emitting device in the long term.

In order to solve the foregoing problem, an insulator is provided as a current blocking layer (CBL) under the pad electrode and the branch electrode so that current can be better spread to the entire light-transmitting conductive film. However, the refractive index (e.g., 1.8-2.0) of the light-transmitting conductive film, which is made of ITO, etc., is greater than the refractive index (e.g., 1.5) of the insulator, which is made of $SiO_2$, etc. As such, light is refracted on the interface between the insulator and the light-transmitting conductive film, and the reflection factor of light is reduced on the pad electrode and the branch electrode. As a result, there is a problem that light extraction efficiency of the semiconductor light-emitting device is reduced.

SUMMARY

The problems to be solved by the present disclosure will be described in the latter part of the detailed description.

This section provides a general summary of the disclosure and may not be a comprehensive disclosure of its full scope or all of its features.

According to one aspect of the present disclosure, there is provided a semiconductor light-emitting device which includes: a plurality of semiconductor layers composed of a first semiconductor layer having first conductivity, a second semiconductor layer having second conductivity different than the first conductivity, and an active layer disposed between the first semiconductor layer and the second semiconductor layer and generating light by recombination of electrons and holes; a first electrode disposed on the second semiconductor layer; a high-resistance body interposed between the second semiconductor layer and the first electrode; and a light-transmitting conductive film covering the second semiconductor layer and the high-resistance body, electrically connecting the second semiconductor layer to the first electrode, and having an opening through which the high-resistance body is exposed, the first electrode being brought into contact with the light-transmitting conductive film, which is disposed on the high-resistance body, and the high-resistance body, which is exposed through the opening.

The advantageous effects of the present disclosure will be described in the latter part of the detailed description.

DETAILED DESCRIPTION

The present disclosure will now be described in detail with reference to the accompanying drawings.

Figure 1:
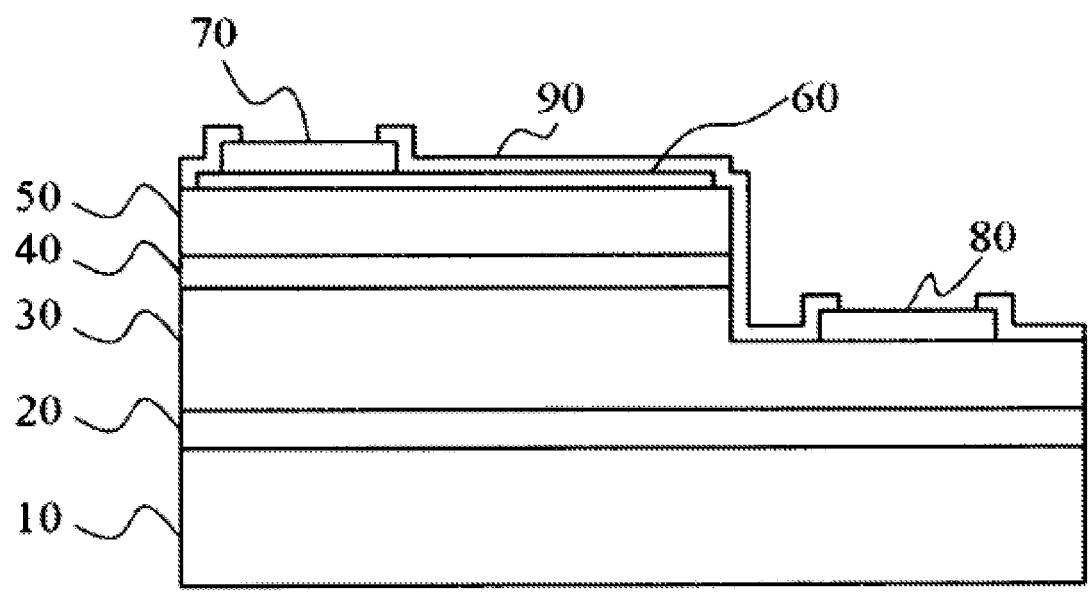
FIG. 1 is a view showing an example of a conventional III-nitride semiconductor light-emitting device.
Figure 2:
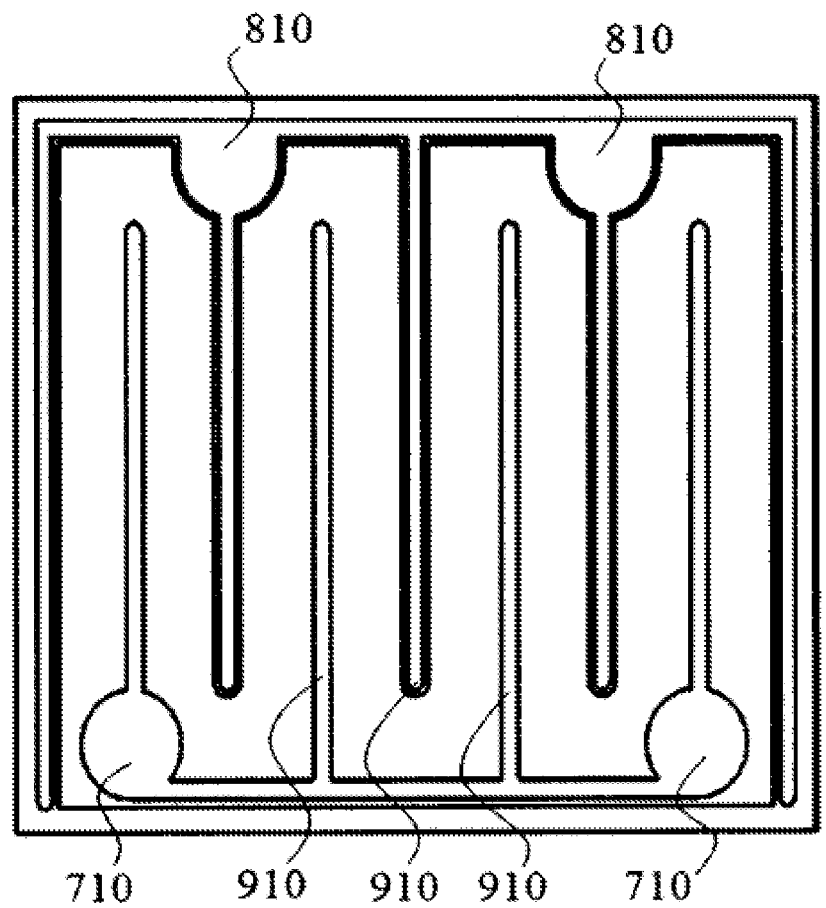
FIG. 2 is a view showing an example of an electrode structure described in U.S. Pat. No. 6,307,218.
Figure 3:
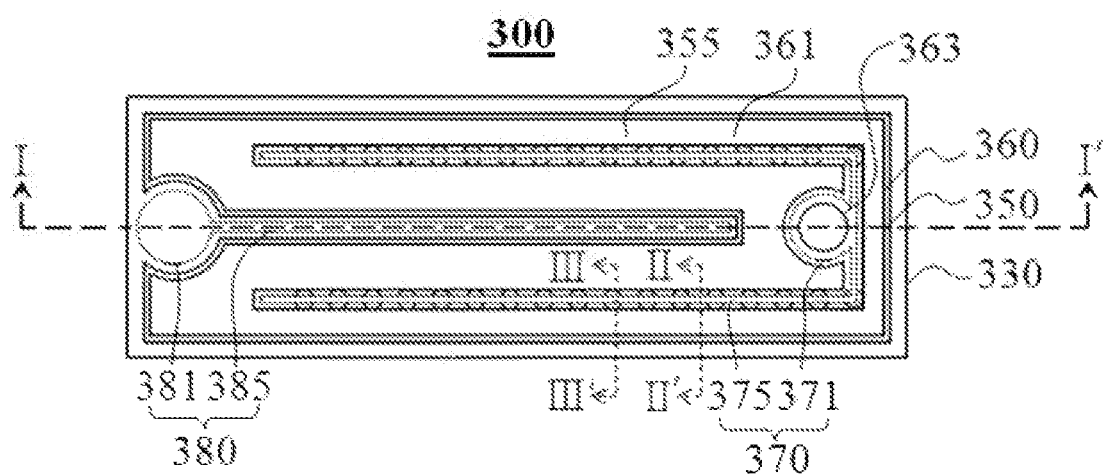
FIG. 3 is a view showing an embodiment of a semiconductor light-emitting device according to the present disclosure.
Figure 4:
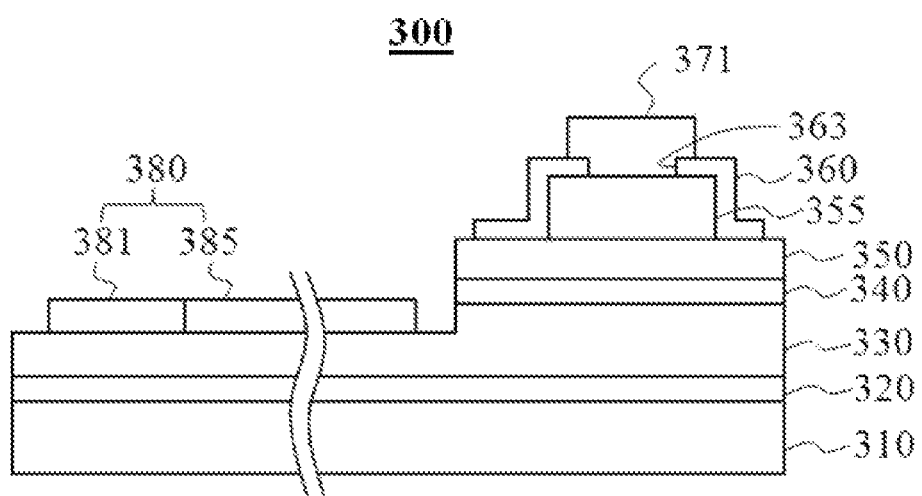
FIG. 4 is a cutaway sectional view showing the semiconductor light-emitting device, taken along line I-I' of FIG. 3.

FIG. 3 is a view showing an embodiment of a semiconductor light-emitting device according to the present disclosure, and FIG. 4 is a cutaway sectional view showing the semiconductor light-emitting device, taken along line I-I' of FIG. 3.

A semiconductor light-emitting device 300 includes a substrate 310, a buffer layer 320, a plurality of semiconductor layers, a high-resistance body 355, a light-transmitting conductive film 360, a first electrode 370, and a second electrode 380. The plurality of semiconductor layers are composed of a first semiconductor layer 330, an active layer 340, and a second semiconductor layer 350. The buffer layer 320, the first semiconductor layer 330, the active layer 340 and the second semiconductor layer 350 are formed on the substrate 310. The semiconductor layers, which are epitaxially grown on the substrate 310, are mostly grown by metal organic chemical vapor deposition (MOCVD). If necessary, each layer may include sub-layers.

Here, an explanation is made, based on the assumption that the first semiconductor layer 330, the second semiconductor layer 350 and the active layer 340 are made of a III-V compound semiconductor, in particular, a III-nitride semiconductor represented as $Al_{(x)}Ga_{(y)}In_{(1-x-y)}N$ ($0 \leq x \leq 1$, $0 \leq y \leq 1$, $0 \leq x+y \leq 1$).

With regard to the substrate 310, a GaN-based substrate can be used as a homo-substrate, and a sapphire substrate, an SiC substrate, an Si substrate or the like can be used as a hetero-substrate. However, any type of substrate may be employed as far as it can have a III-nitride semiconductor layer grown thereon.

The first semiconductor layer 330 and the second semiconductor layer 350 are provided with different conductivity. In the present disclosure, for example, the first semiconductor layer 330 is an n-type nitride semiconductor layer 330 (e.g., n-type GaN layer), while the second semiconductor layer 350 is a p-type nitride semiconductor layer 350 (e.g., p-type GaN layer).

Figure 5:
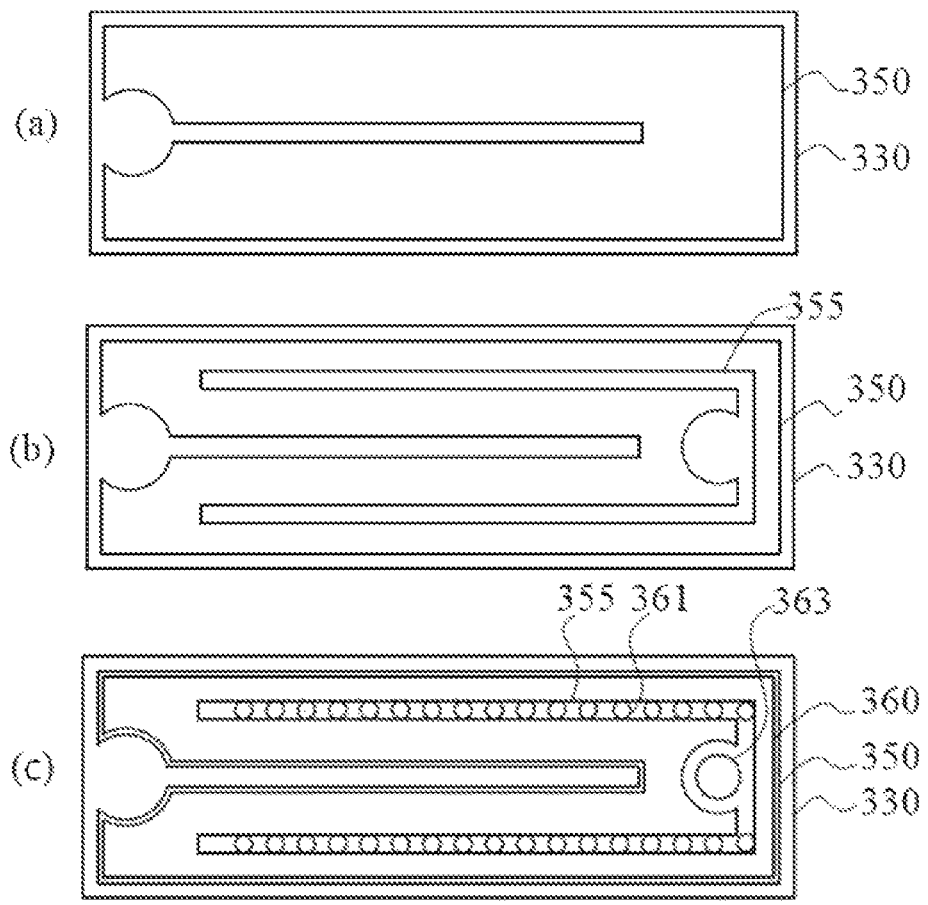
FIG. 5 is a view showing an embodiment of a manufacturing method of a semiconductor light-emitting device according to the present disclosure.

FIG. 5 is a view showing an embodiment of a manufacturing method of a semiconductor light-emitting device according to the present disclosure.

First, as illustrated in FIG. 5a, the plurality of semiconductor layers are formed on the substrate, and then the p-type nitride semiconductor layer 350 and the active layer 340 are mesa-etched to expose the n-type nitride semiconductor layer 330. A dry etching method such as an inductively coupled plasma (ICP) method may be employed to remove a few semiconductor layers. Alternatively, the process of exposing the n-type nitride semiconductor layer 330 may be performed after forming the high-resistance body 355 and the light-transmitting conductive film 360.

Next, the high-resistance body 355 is formed on the p-type nitride semiconductor layer 350 using plasma enhanced chemical vapor deposition (PECVD), low pressure chemical vapor deposition (LPCVD), sputtering, E-beam evaporation, thermal evaporation, etc. As illustrated in FIG. 5b, the high-resistance body 355 is formed in a region corresponding to the first electrode 370 which will be formed later.

The high-resistance body 355 may be made of a material with a smaller refractive index than the light-transmitting conductive film 360, e.g., any one selected from $SiO_2$, $TiO_2$, $AlO_x$, and $NiO_x$.

Then, as illustrated in FIG. 5c, the light-transmitting conductive film 360 is formed, using sputtering, E-beam evaporation, thermal evaporation, etc., to cover the p-type nitride semiconductor layer 350 and the high-resistance body 355. The light-transmitting conductive film 360 serves to improve light uniformity. The light-transmitting conductive film 360 is mostly made of an ITO or Ni/Au oxide film. If the light-transmitting conductive film 360 is too thin, it is disadvantageous in current spreading, which leads to a high driving voltage, and if the light-transmitting conductive film 360 is too thick, it absorbs light, which leads to low light extraction efficiency.

A first opening 361 and a second opening 363, through which the high-resistance body 355 is exposed, are formed on the light-transmitting conductive film 360 provided by the above process. The high-resistance body 355 is composed of a portion covered with the light-transmitting conductive film 360 and a portion exposed through the first opening 361 and the second opening 363.

The width of the first opening 361 may be smaller than that of the high-resistance body 355 and is preferably equal to or slightly larger than that of the high-resistance body 355. In order to prevent excessive reduction of the light emission area, it is more preferable that the width of the first opening 361 should be almost equal to that of the high-resistance body 355. The first opening 361 and the second opening 363 may be formed in various shapes, such as a circle, square, etc. The first opening 361 and the second opening 363 are arranged along the high-resistance body 355.

Then, referring back to FIG. 3, the first electrode 370 and the second electrode 380 are formed using sputtering, E-beam evaporation, thermal evaporation, etc. The first electrode 370 and the second electrode 380 may be formed by stacking, e.g., Cr, Ni and Au. The first electrode 370 is composed of a first pad electrode 371 (p-side pad electrode) and a first branch electrode 375 (p-side branch electrode), while the second electrode 380 is composed of a second pad electrode 381 (n-side pad electrode) and a second branch electrode 385 (n-side branch electrode).

The semiconductor light-emitting device 300 may extend lengthwise in one direction for size increase. FIG. 3 shows a semiconductor light-emitting device 300 which is formed in an approximately rectangular shape. Therefore, the semiconductor light-emitting device 300 has long sides and short sides.

The n-side pad electrode 381 and the n-side branch electrode 385 are formed on the n-type nitride semiconductor layer 330, while the p-side pad electrode 371 and the p-side branch electrode 375 are formed on the light-transmitting conductive film 360. For example, as illustrated in FIGS. 3 and 4, the n-side pad electrode 381 and the p-side pad electrode 371 are positioned on the opposite short sides. The n-side branch electrode 385 extends along the center of the semiconductor light-emitting device 300 from the n-side pad electrode 381 toward the p-side pad electrode 371. The two p-side branch electrodes 375 extend from the p-side pad electrode 371 to both sides of the n-side branch electrode 385. The shape and arrangement of the n-side pad electrode 381, the n-side branch electrode 385, the p-side pad electrode 371 and the p-side branch electrode 375 may be changed in various ways.

The high-resistance body 355 under the p-side pad electrode 371 has a larger width than the p-side pad electrode 371. As described above, the light-transmitting conductive film 360 between the high-resistance body 355 and the p-side pad electrode 371 is provided with the second opening 363. Thus, as illustrated in FIG. 4, the p-side pad electrode 371 is brought into contact with the high-resistance body 355 exposed through the second opening 363. The second opening 363 may have a smaller width than the p-side pad electrode 371. The p-side pad electrode 371 is brought into contact with the light-transmitting conductive film 360 extending on the high-resistance body 355.

Figure 6:
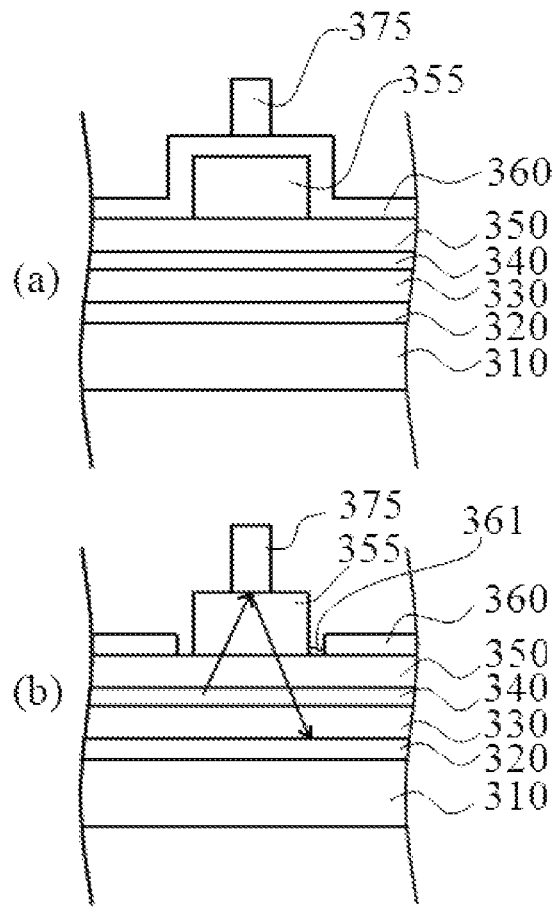
FIG. 6 is a cutaway sectional view showing the semiconductor light-emitting device, taken along lines II-II' (FIG. 6a) and III-III' (FIG. 6b) of FIG. 3.

FIG. 6 is a cutaway sectional view showing the semiconductor light-emitting device, taken along lines II-II' (FIG. 6a) and III-III' (FIG. 6b) of FIG. 3.

As illustrated in FIGS. 6a and 6b, the p-side branch electrode 375 is positioned on the high-resistance body 355. Referring back to FIG. 3, the plurality of first openings 361, through which the high-resistance body 355 is exposed, are arranged in an island shape on the light-transmitting conductive film 360. The p-side branch electrode 375 is brought into contact with the light-transmitting conductive film 360 disposed on the high-resistance body 355, as shown in FIG. 6a, and is alternately brought into contact with the high-resistance body 355 exposed through the first opening 361, as shown in FIG. 6b. The first openings 361 are arranged along the p-side branch electrode 375. The width of the first opening 361 may be smaller than that of the p-side branch electrode 375 and is preferably equal to or slightly larger than that of the p-side branch electrode 375. However, it is more preferable that the width of the first opening 361 should be almost equal to that of the high-resistance body 355.

Current applied through the p-side pad electrode 371 is spread through the p-side branch electrode 375 and the light-transmitting conductive film 360. As described above, the high-resistance body 355 may be made of an insulating material. Since the high-resistance body 355 has a resistance high enough to intercept current in a direct downward direction, current flowing through the p-side branch electrode 375 can be better spread to the light-transmitting conductive film 360.

Figure 7:
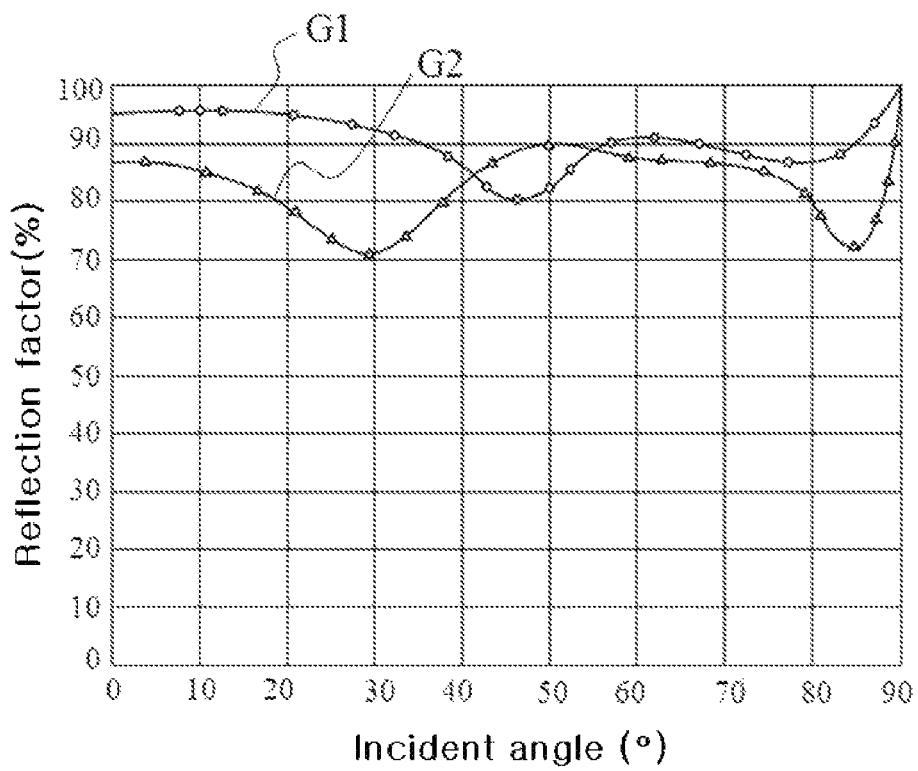
FIG. 7 is a view for explaining characteristics of the embodiment of the semiconductor light-emitting device according to the present disclosure.

FIG. 7 is a view for explaining characteristics of the embodiment of the semiconductor light-emitting device according to the present disclosure.

In FIG. 7, the axis of abscissa represents an incident angle of light incident on the high-resistance body 355, and the axis of ordinates represents a reflection factor of light on the p-side pad electrode 371 and the p-side branch electrode 375. G2 shows simulation results of a typical semiconductor light-emitting device, in which there is no opening on the light-transmitting conductive film 360 disposed on the high-resistance body 355, while G1 shows simulation results of the semiconductor light-emitting device 300 according to the present disclosure.

It can be seen from FIG. 7 that the reflection factor of the semiconductor light-emitting device 300 according to the present disclosure has been further improved than that of the typical semiconductor light-emitting device. More specifically, it can be seen that power of the semiconductor light-emitting device 300 according to the present disclosure has been further increased than that of the typical semiconductor light-emitting device with respect to the same input. The operating voltage may rise due to a decrease in the light-transmitting electrode area caused by the first opening 361 and the second opening 363. However, it only rises from 3.13 V to 3.14 V, i.e., by about 0.3%. As a result, it is possible to improve light extraction efficiency without causing a significant increase in the operating voltage by the first opening 361 and the second opening 363.

$SiO_2$ of the high-resistance body 355 has a refractive index of about 1.5, while ITO of the light-transmitting conductive film 360 has a refractive index of about 1.8 to 2.0. Since the typical semiconductor light-emitting device does not have the first opening 361 and the second opening 363, light generated in the active layer 340 and incident on the high-resistance body 355 is refracted on the interface between the high-resistance body 355 and the light-transmitting conductive film 360. It is considered that the reflection factor of light is reduced on the p-side pad electrode 371 and the p-side branch electrode 375 due to such refraction.

On the contrary, in the semiconductor light-emitting device 300 according to the present disclosure, the first opening 361 and the second opening 363 allow part of the light incident on the high-resistance body 355 to be incident on the p-side branch electrode 375 and the p-side pad electrode 371 without passing through the light-transmitting conductive film 360, which leads to an increase in the reflection factor. Consequently, it means an increase in an amount of light emitted from the semiconductor light-emitting device 300.

The increase in the reflection factor caused by the openings on the light-transmitting conductive film 360 is not significantly relevant to the shape of the first opening 361 and the second opening 363. If the first opening 361 and the second opening 363 have a too large area, the operating voltage may rise due to a high resistance, and if the first opening 361 and the second opening 363 have a too small area, light extraction efficiency may not be improved enough. Therefore, as described above, the width of the first opening 361 may be smaller or larger than that of the p-side branch electrode 375, but is preferably almost equal to that of the high-resistance body 355. For example, the width of the first opening 361 may be larger than 5 μm and smaller than 40 μm. Moreover, preferably, in the area of the first opening 361 and the area of the p-side branch electrode 375 brought into contact with the high-resistance body 355, the opening/contact ratio ranges from 10% to 90%.

Various embodiments of the present disclosure will now be described.

A high-resistance body is not limited to the aforementioned materials, but may be made of another material, such as SiN, SiON, etc.

The present disclosure can be applied to a semiconductor light-emitting device having a CBL structure, regardless of whether it has a branch electrode or not.

The width of an opening is dependent upon the width of a first branch electrode and can be determined to such an extent that the improvement of light extraction efficiency is more significant than the rise of the operating voltage.

The present disclosure can be applied to a case where an opening is formed only on a light-transmitting conductive film disposed under a first pad electrode, a case where an opening is formed only on a light-transmitting conductive film disposed under a first branch electrode, and a case where an opening is formed both on a light-transmitting conductive film disposed under a first pad electrode and a light-transmitting conductive film disposed under a first branch electrode.

A second electrode can be used, regardless of whether it has a second branch electrode or not.

A semiconductor light-emitting device according to the present disclosure can have high light extraction efficiency.

Additionally, it is possible to improve an output of a semiconductor light-emitting device having a CBL structure.

What is claimed is:

1. A semiconductor light-emitting device, comprising:
a plurality of semiconductor layers composed of a first semiconductor layer having first conductivity, a second semiconductor layer having second conductivity different than the first conductivity, and an active layer disposed between the first semiconductor layer and the second semiconductor layer and generating light by recombination of electrons and holes;
a high-resistance body made of an insulating material on the second semiconductor layer;
a light-transmitting conductive film covering the second semiconductor layer and the high-resistance body; and
a first electrode disposed on the light-transmitting conductive film;
wherein the light-transmitting conductive film electrically connects the second semiconductor layer to the first electrode and has an opening through which the high-resistance body is exposed, and,
wherein the first electrode is brought into contact with the light-transmitting conductive film which is disposed on the high-resistance body, and with the high-resistance body which is exposed through the opening.

2. The semiconductor light-emitting device as claimed in claim 1, wherein the light-transmitting conductive film has a greater refractive index than the high-resistance body.

3. The semiconductor light-emitting device as claimed in claim 2, wherein the high-resistance body comprises at least one of $SiO_2$, $TiO_2$, $AlO_x$, and $NiO_x$.

4. The semiconductor light-emitting device as claimed in claim 1, wherein the first electrode comprises:
a first pad electrode disposed on the high-resistance body; and
a first branch electrode disposed on the high-resistance body and electrically connected to the first pad electrode.

5. The semiconductor light-emitting device as claimed in claim 4, wherein the light-transmitting conductive film is provided with a plurality of openings which are arranged along the first branch electrode to expose the high-resistance body, and the first branch electrode is alternately brought into contact with the light-transmitting conductive film, which is disposed on the high-resistance body, and the high-resistance body, which is exposed through the openings.

6. The semiconductor light-emitting device as claimed in claim 5, wherein the width of the high-resistance body is larger than that of the first branch electrode, and the width of the opening is equal to or larger than that of the first branch electrode.

7. The semiconductor light-emitting device as claimed in claim 6, wherein the width of the opening is larger than 5 μm and smaller than 40 μm.

8. The semiconductor light-emitting device as claimed in claim 4, wherein the opening is formed on the light-transmitting conductive film disposed under the first pad electrode, and the first pad electrode is brought into contact with the high-resistance body exposed through the opening.

9. The semiconductor light-emitting device as claimed in claim 4, further comprising a second electrode disposed on the first semiconductor layer exposed by mesa-etching,
wherein the second electrode comprises a second pad electrode disposed on the exposed first semiconductor layer and a second branch electrode extending on the exposed first semiconductor layer and electrically connected to the second pad electrode.

10. The semiconductor light-emitting device as claimed in claim 9, wherein the semiconductor light-emitting device is formed in a rectangular shape with long sides and short sides, the first pad electrode and the second pad electrode are positioned on the opposite short sides, respectively, the second branch electrode extends in a long-side direction, and the first branch electrode extends to both sides of the second branch electrode, and
wherein the light-transmitting conductive film is provided with a plurality of first openings, which are arranged along the first branch electrode to expose the high-resistance body, and a second opening, which corresponds to the first pad electrode, the first branch electrode is alternately brought into contact with the light-transmitting conductive film, which is disposed on the high-resistance body, and the high-resistance body, which is exposed through the first openings, and the first pad electrode is brought into contact with the high-resistance body exposed through the second opening.

11. The semiconductor light-emitting device as claimed in claim 1, wherein the light-transmitting conductive film has a greater refractive index than the high-resistance body, and the high-resistance body comprises at least one of $SiO_2$, $TiO_2$, $AlO_x$, and $NiO_x$, and
wherein the first electrode comprises a first pad electrode disposed on the high-resistance body and a first branch electrode disposed on the high-resistance body and electrically connected to the first pad electrode.

12. The semiconductor light-emitting device as claimed in claim 11, wherein the light-transmitting conductive film is provided with a plurality of openings which are arranged along the first branch electrode to expose the high-resistance body, and the first branch electrode is alternately brought into contact with the light-transmitting conductive film, which is disposed on the high-resistance body, and the high-resistance body, which is exposed through the openings.

13. The semiconductor light-emitting device as claimed in claim 12, wherein the width of the high-resistance body is larger than that of the first branch electrode, and the width of the opening is equal to or larger than that of the first branch electrode.

14. The semiconductor light-emitting device as claimed in claim 13, wherein the width of the opening is larger than 5 μm and smaller than 40 μm.

15. The semiconductor light-emitting device as claimed in claim 11, wherein the opening is formed on the light-transmitting conductive film disposed under the first pad electrode, and the first pad electrode is brought into contact with the high-resistance body exposed through the opening.

16. The semiconductor light-emitting device as claimed in claim 11, further comprising a second electrode disposed on the first semiconductor layer exposed by mesa-etching,
wherein the second electrode comprises a second pad electrode disposed on the exposed first semiconductor layer and a second branch electrode extending on the exposed first semiconductor layer and electrically connected to the second pad electrode.

17. The semiconductor light-emitting device as claimed in claim 16, wherein the semiconductor light-emitting device is formed in a rectangular shape with long sides and short sides, the first pad electrode and the second pad electrode are positioned on the opposite short sides, respectively, the second branch electrode extends in a long-side direction, and the first branch electrode extends to both sides of the second branch electrode, and
wherein the light-transmitting conductive film is provided with a plurality of first openings, which are arranged along the first branch electrode to expose the high-resistance body, and a second opening, which corresponds to the first pad electrode, the first branch electrode is alternately brought into contact with the light-transmitting conductive film, which is disposed on the high-resistance body, and the high-resistance body, which is exposed through the first openings, and the first pad electrode is brought into contact with the high-resistance body exposed through the second opening.

\* \* \* \* \*